(12) United States Patent
Lesso

(10) Patent No.: US 12,035,631 B2
(45) Date of Patent: Jul. 9, 2024

(54) DRIVER CIRCUITRY FOR PIEZOELECTRIC TRANSDUCERS

(71) Applicant: Cirrus Logic International Semiconductor Ltd., Edinburgh (GB)

(72) Inventor: John P. Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 267 days.

(21) Appl. No.: 16/905,171

(22) Filed: Jun. 18, 2020

(65) Prior Publication Data
US 2021/0399201 A1 Dec. 23, 2021

(51) Int. Cl.
*H02N 2/06* (2006.01)
*H10N 30/80* (2023.01)

(52) U.S. Cl.
CPC .......... *H10N 30/802* (2023.02); *H02N 2/062* (2013.01)

(58) Field of Classification Search
CPC ...... H02N 2/062; H02M 1/0095; H02M 3/07; H02M 3/072; H02M 3/071; B06B 1/0215; B06B 1/0253; B06B 1/292; H01L 41/042; H03G 3/30
See application file for complete search history.

(56) References Cited

U.S. PATENT DOCUMENTS

| | | | | |
|---|---|---|---|---|
| 9,872,606 B2* | 1/2018 | Yeoh | ..................... | H10N 30/204 |
| 10,349,818 B2* | 7/2019 | Yeoh | ................... | A61B 1/00006 |
| 10,447,152 B2* | 10/2019 | Zhang | ................. | H02M 7/4837 |
| 10,826,452 B2* | 11/2020 | King | .................... | H03F 1/0227 |
| 11,146,171 B2* | 10/2021 | Lesso | ....................... | H03G 3/30 |
| 11,152,906 B2* | 10/2021 | King | ...................... | H03F 1/0211 |
| 2008/0150619 A1* | 6/2008 | Lesso | ...................... | H02M 3/07 |
| | | | | 327/536 |
| 2008/0272833 A1* | 11/2008 | Ivanov | ...................... | H03F 3/70 |
| | | | | 327/536 |
| 2009/0102439 A1* | 4/2009 | Williams | ................ | H02M 3/07 |
| | | | | 323/266 |
| 2009/0146528 A1* | 6/2009 | Bachmaier | ............... | H02N 2/06 |
| | | | | 310/317 |
| 2012/0170770 A1* | 7/2012 | Lesso | ...................... | H02M 3/07 |
| | | | | 327/536 |
| 2016/0324403 A1* | 11/2016 | Yeoh | ..................... | H10N 30/802 |
| 2018/0019666 A1* | 1/2018 | Zhang | ..................... | H02M 3/07 |
| 2018/0103834 A1* | 4/2018 | Yeoh | ................... | A61B 1/00006 |
| 2018/0248477 A1* | 8/2018 | Kline | ...................... | H02M 1/08 |
| 2018/0376252 A1* | 12/2018 | King | ..................... | H04R 17/00 |
| 2019/0306641 A1* | 10/2019 | Wilson | ................ | H04R 29/004 |

OTHER PUBLICATIONS

International Search Report and Written Opinion of the International Searching Authority, International Application No. PCT/GB2021/051365, mailed Sep. 2, 2021.

\* cited by examiner

*Primary Examiner* — Olga V Merkoulova
(74) *Attorney, Agent, or Firm* — Jackson Walker L.L.P.

(57) ABSTRACT

The present disclosure relates to driver circuitry for driving a piezoelectric transducer. The circuitry comprises: output stage circuitry configured to receive an input signal and to drive the piezoelectric transducer to produce the output signal; variable voltage power supply circuitry configured to output a supply voltage for the charge drive output stage circuitry, wherein the supply voltage output by the variable voltage power supply circuitry varies based on the input signal; a supply capacitor for receiving the supply voltage output by the variable voltage power supply circuitry; a reservoir capacitor; and circuitry for transferring charge between the reservoir capacitor and the supply capacitor.

15 Claims, 12 Drawing Sheets

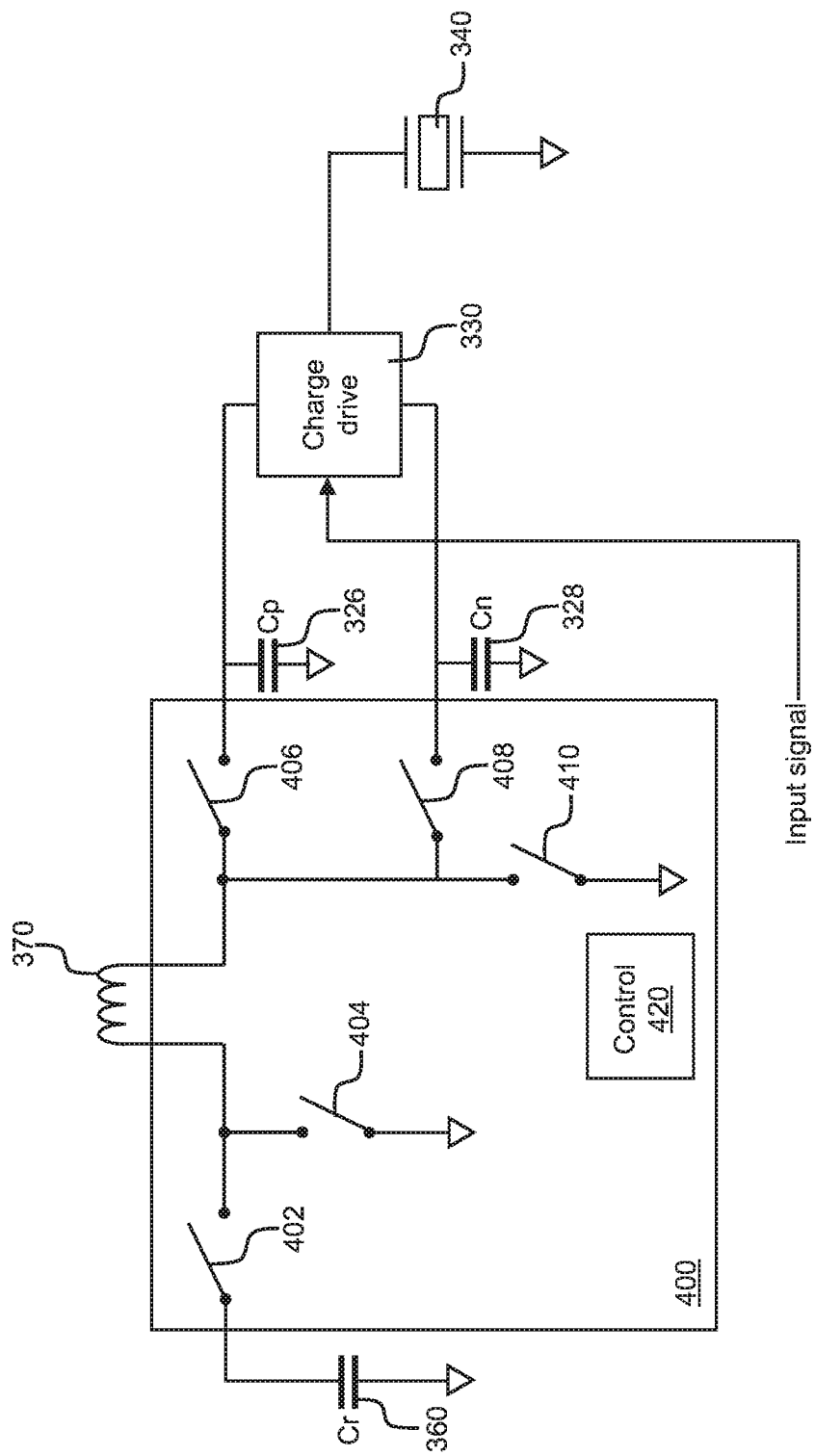

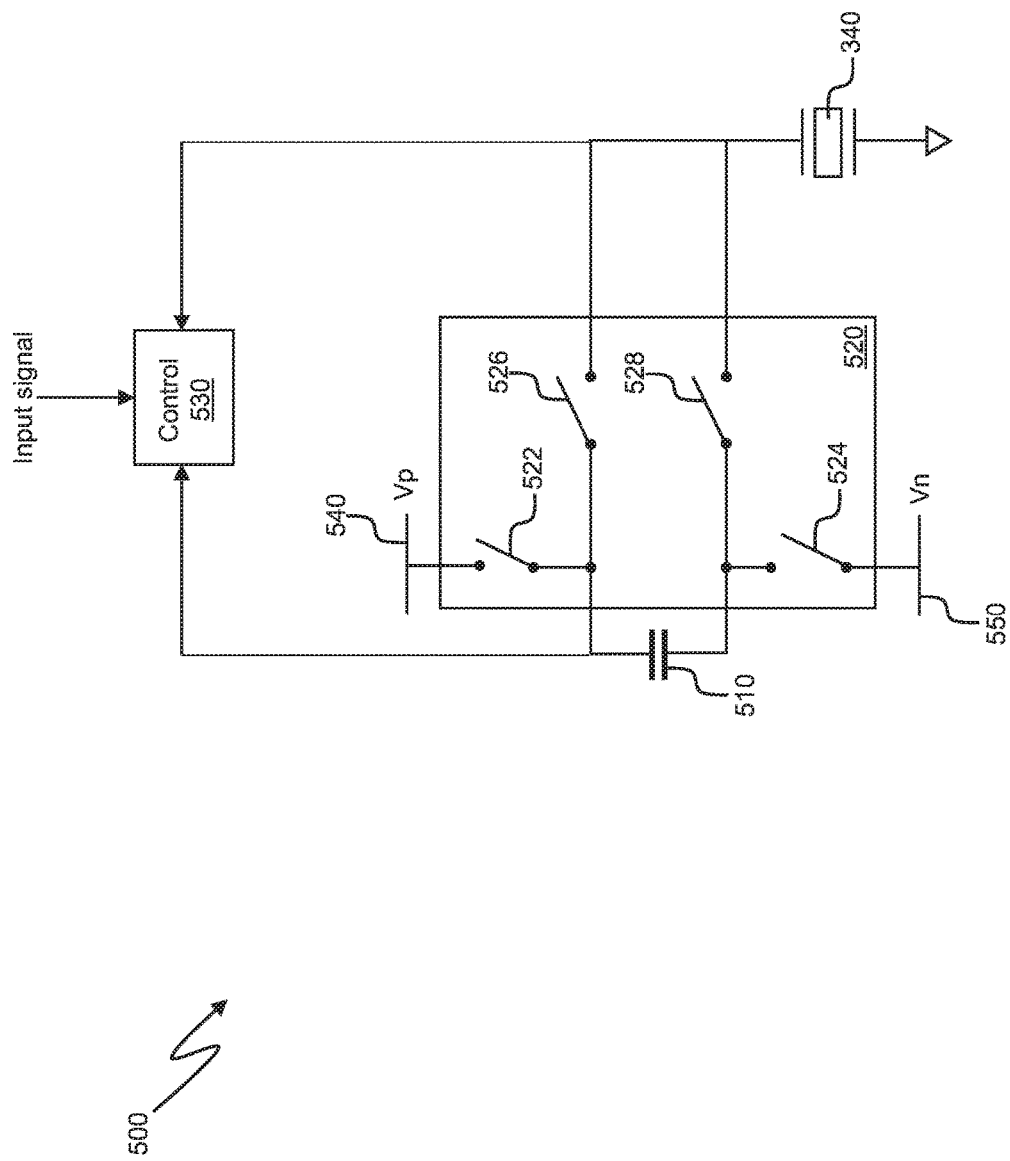

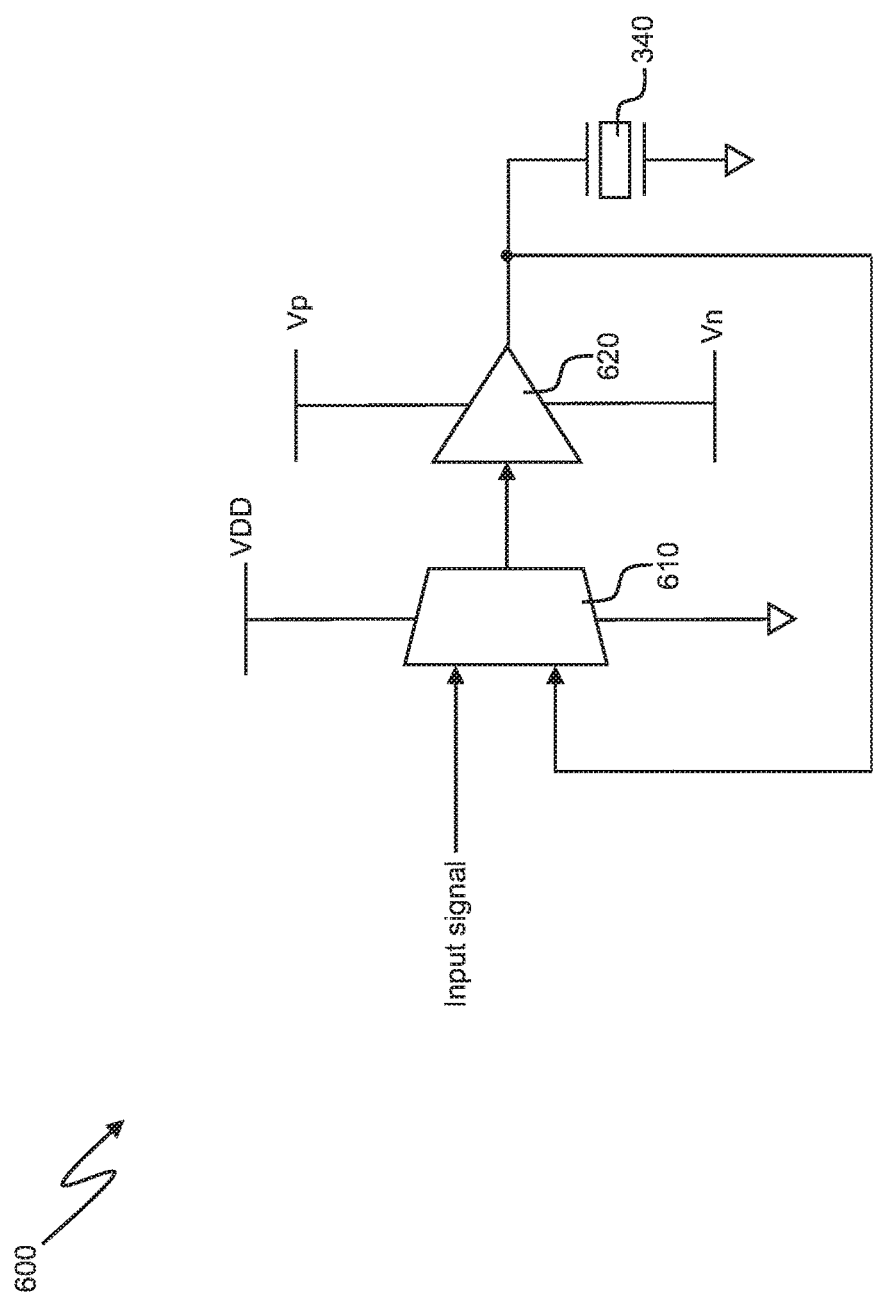

DRIVER CIRCUITRY FOR PIEZOELECTRIC TRANSDUCERS

FIELD OF THE INVENTION

The present disclosure relates to driver circuitry for piezoelectric transducers.

BACKGROUND

Piezoelectric transducers are increasingly being seen as a viable alternative to transducers such as speakers and resonant actuators for providing audio and/or haptic outputs in devices such as mobile telephones, laptop and tablet computers and the like. Piezoelectric transducers are also increasingly finding application as transducers for ultrasonic sensing and range-finding systems.

Piezoelectric transducers can be voltage-driven. However, when driven by voltage piezoelectric transducers exhibit both hysteresis and creep, which means that when driven by voltage the displacement of a piezoelectric transducer depends on both the currently-applied voltage and on a previously-applied voltage. Thus, for any given driving voltage there are multiple possible displacements of the piezoelectric transducer. For audio applications this manifests as distortion.

One way of reducing hysteresis and creep and the associated problems in a piezoelectric transducers is to drive the transducer with charge instead of voltage. When driven with charge, the displacement of the piezoelectric transducer varies with the charge applied.

FIG. 1 is a schematic illustration of circuitry for driving a piezoelectric transducer with charge. As shown generally at 100 in FIG. 1, charge drive circuitry 102, which may be charge pump circuitry, for example, may receive an electrical input signal (e.g. an input audio or ultrasonic signal or haptic waveform) from upstream circuitry (not shown) such as amplifier circuitry, and drive a piezoelectric transducer 104 to cause the piezoelectric transducer 104 to produce an audible or haptic output based on the electrical input signal.

SUMMARY

According to a first aspect, the invention provides circuitry for driving a piezoelectric transducer, the circuitry comprising:
  output stage circuitry configured to receive an input signal and to drive the piezoelectric transducer to produce the output signal;
  variable voltage power supply circuitry configured to output a supply voltage for the charge drive output stage circuitry, wherein the supply voltage output by the variable voltage power supply circuitry varies based on the input signal;
  a supply capacitor for receiving the supply voltage output by the variable voltage power supply circuitry;
  a reservoir capacitor; and
  circuitry for transferring charge between the reservoir capacitor and the supply capacitor.

The output stage circuitry may comprises charge drive circuitry.

The circuitry may further comprise circuitry configured to transmit a control signal to the variable voltage power supply circuitry to cause the variable voltage power supply circuitry to adjust the magnitude of the supply voltage for the output stage circuitry based on the input signal.

The circuitry configured to transmit a control signal to the variable voltage power supply circuitry to cause the variable voltage power supply circuitry to adjust the magnitude of the supply voltage for the output stage circuitry based on the input signal may comprise look-ahead circuitry, for example.

The look-ahead circuitry may be configured to monitor a level of the input signal, and the control signal may be based on the level of the input signal.

The look-ahead circuitry may be configured to monitor an envelope of the input signal, and the control signal may be based on the envelope of the input signal.

The circuitry for transferring charge between the reservoir capacitor and the supply capacitor may comprise a switch network and one or more inductors.

The circuitry may further comprise control circuitry to control operation of the switch network to transfer charge between the reservoir capacitor and the supply capacitor via at least one of the one or more inductors.

The variable voltage power supply circuitry may be configured to output a positive supply voltage and a negative supply voltage for the charge drive output stage circuitry.

The circuitry may comprise a first supply capacitor for the positive supply voltage and a second supply capacitor for the negative supply voltage.

The circuitry may further comprise signal processing circuitry configured to process the input signal and to output a processed version of the input signal to the charge drive output stage circuitry.

The signal processing circuitry may comprise one or more of:
  filter circuitry;
  digital-to-analogue converter circuitry;
  envelope detector circuitry; and
  delay circuitry.

The input signal may be an audio signal, for example.
The input signal may be a haptic signal.
The input signal may be an ultrasonic signal.
The output stage circuitry may comprise charge pump circuitry.
The output stage circuitry may comprise linear amplifier circuitry.

The variable voltage power supply circuitry may be configured to output a positive supply voltage and a negative supply voltage for the charge drive output stage circuitry, and the linear amplifier circuitry may comprise:
  an input stage that receives a fixed supply voltage from positive and reference voltage supplies; and
  an output stage that receives the positive and negative supply voltages from the variable voltage power supply circuitry.

The output stage circuitry may comprises:
  a current source;
  a current sink; and
  control circuitry;
and the control circuitry may be configured to control the operation of the current source and the current sink to selectively charge and discharge the piezoelectric transducer based on the input signal.

The circuitry may further comprise commutator circuitry coupled to the output stage circuitry, the commutator circuitry being configured to selectively couple a first or a second terminal of the piezoelectric transducer to an output of the output stage circuitry.

According to a second aspect, the invention provides integrated circuitry comprising the circuitry of the first aspect.

According to a third aspect, the invention provides a device comprising the circuitry of the first aspect. The device may comprise a mobile telephone, a tablet or laptop computer, a smart speaker, an accessory device, headphones, earphones or earbuds, for example.

BRIEF DESCRIPTION OF THE DRAWINGS

Embodiments of the invention will now be described, strictly by way of example only, with reference to the accompanying drawings, of which:

FIG. 4a illustrates an example switch network for transferring charge around the circuitry of FIG. 3;

FIG. 5 is a schematic diagram illustrating an example of charge drive circuitry for driving a piezoelectric transducer;

FIG. 6 is a schematic diagram illustrating an alternative example of charge drive circuitry for driving a piezoelectric transducer;

DETAILED DESCRIPTION

Figure 1:
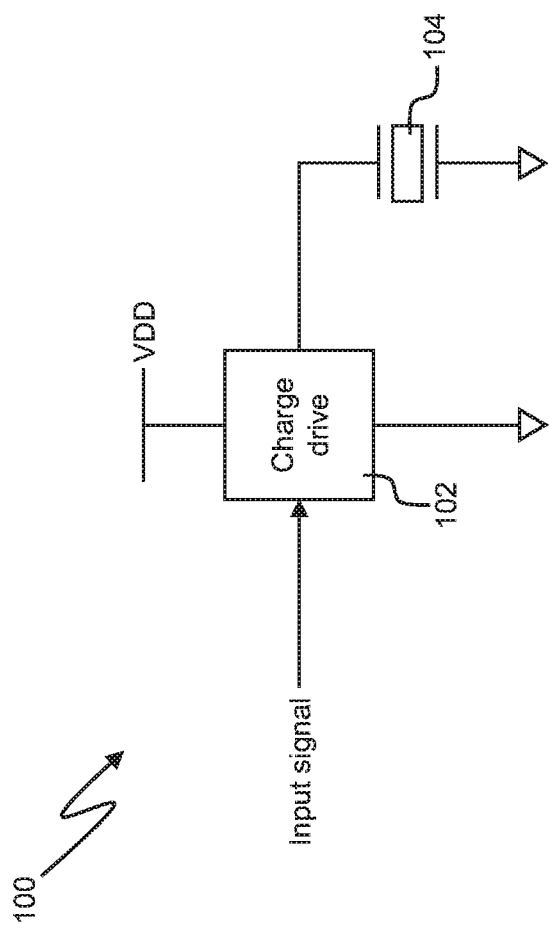
FIG. 1 is a schematic diagram illustrating the concept of driving a piezoelectric transducer with charge.

In the circuitry 100 of FIG. 1, the charge drive circuitry 102 is powered by a fixed voltage supply provided by positive (e.g. VDD) and reference (e.g. 0V or ground) supply voltage rails. The power efficiency of this arrangement is limited because the supply voltage to the charge drive circuitry 102 may be significantly higher than is necessary to drive the piezoelectric transducer 104 for an input signal of a given magnitude.

One way to improve the power efficiency of the circuitry of FIG. 1 is to adjust the supply voltage to the charge drive circuitry 102 according to a level (e.g. an amplitude or an envelope) of the electrical input signal, such that the supply voltage to the charge drive circuitry 102 is sufficient to drive the piezoelectric transducer 104 without introducing distortion into the output signal, but does not include excess voltage headroom that is not necessary for driving the piezoelectric transducer 104.

Figure 2:
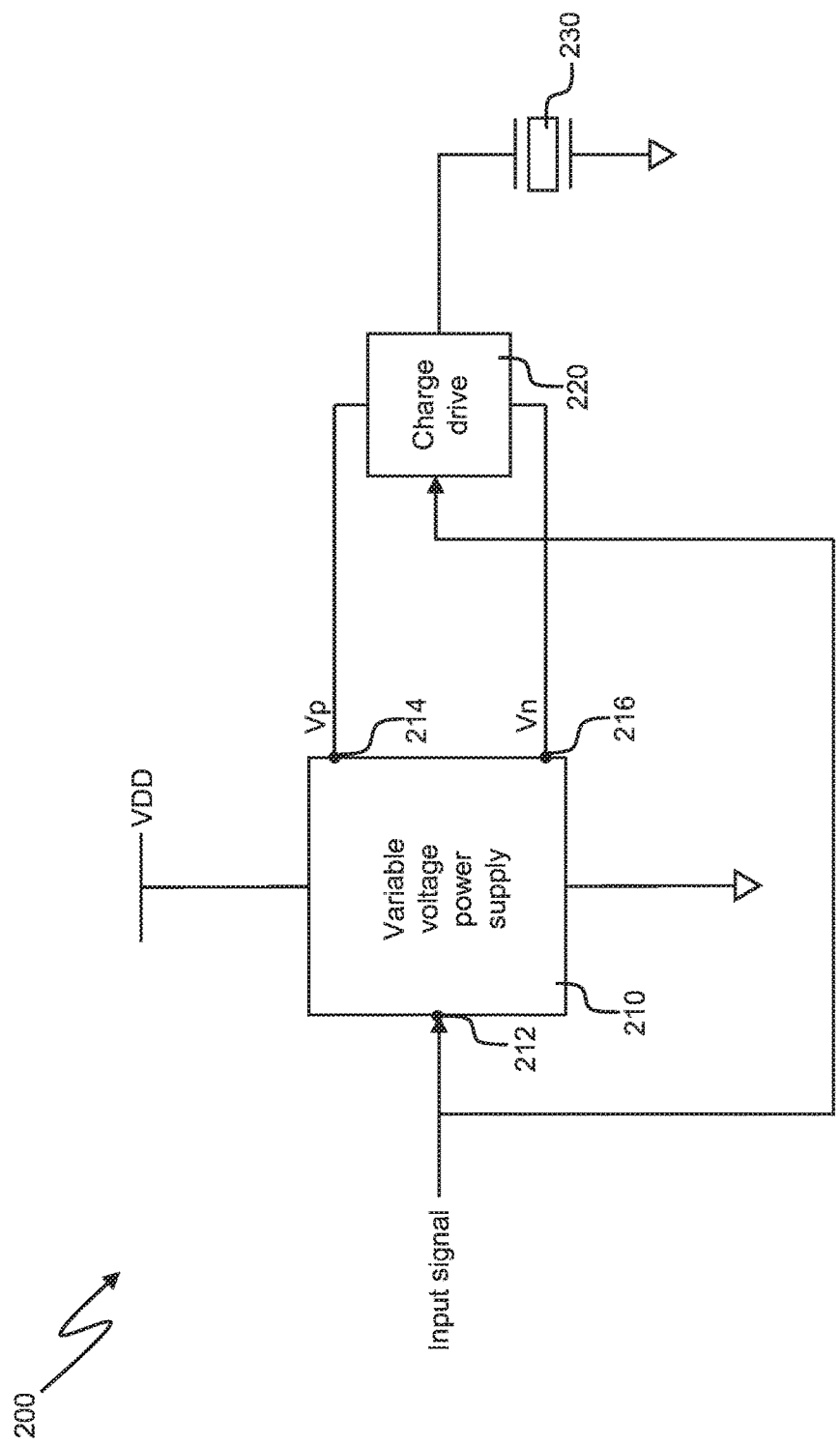
FIG. 2 is a schematic diagram illustrating circuitry for driving a piezoelectric transducer including variable voltage power supply circuitry.

This concept is illustrated schematically in FIG. 2, which shows circuitry 200 including variable voltage power supply circuitry 210 having an input terminal 212 for receiving an input signal and first and second output terminals 214, 216, for providing positive (Vp) and negative (Vn) supply voltages to charge drive circuitry 220 (e.g. charge pump circuitry) which drives a piezoelectric transducer 230.

The charge drive circuitry 220 is configured to receive the input signal and to drive the piezoelectric transducer 230 with charge to cause the piezoelectric transducer 230 to produce an audible or haptic output based on the electrical input signal.

The variable voltage power supply 210 receives a fixed supply voltage from positive (e.g. VDD) and reference (e.g. 0V or ground) voltage rails and outputs the variable positive and negative supply voltages Vp, Vn to the charge drive circuitry 220. The magnitude of the variable positive and negative supply voltages Vp, Vn varies based on a level (e.g. an amplitude of envelope) of the electrical input signal, such that the supply voltage to the charge drive circuitry 220 is sufficient to drive the piezoelectric transducer 230 without introducing distortion into the output produced by the piezoelectric transducer, but does not include unnecessary additional voltage headroom, thereby improving the power efficiency of the circuitry 200 as compared to the circuitry 100 of FIG. 1.

Figure 3:
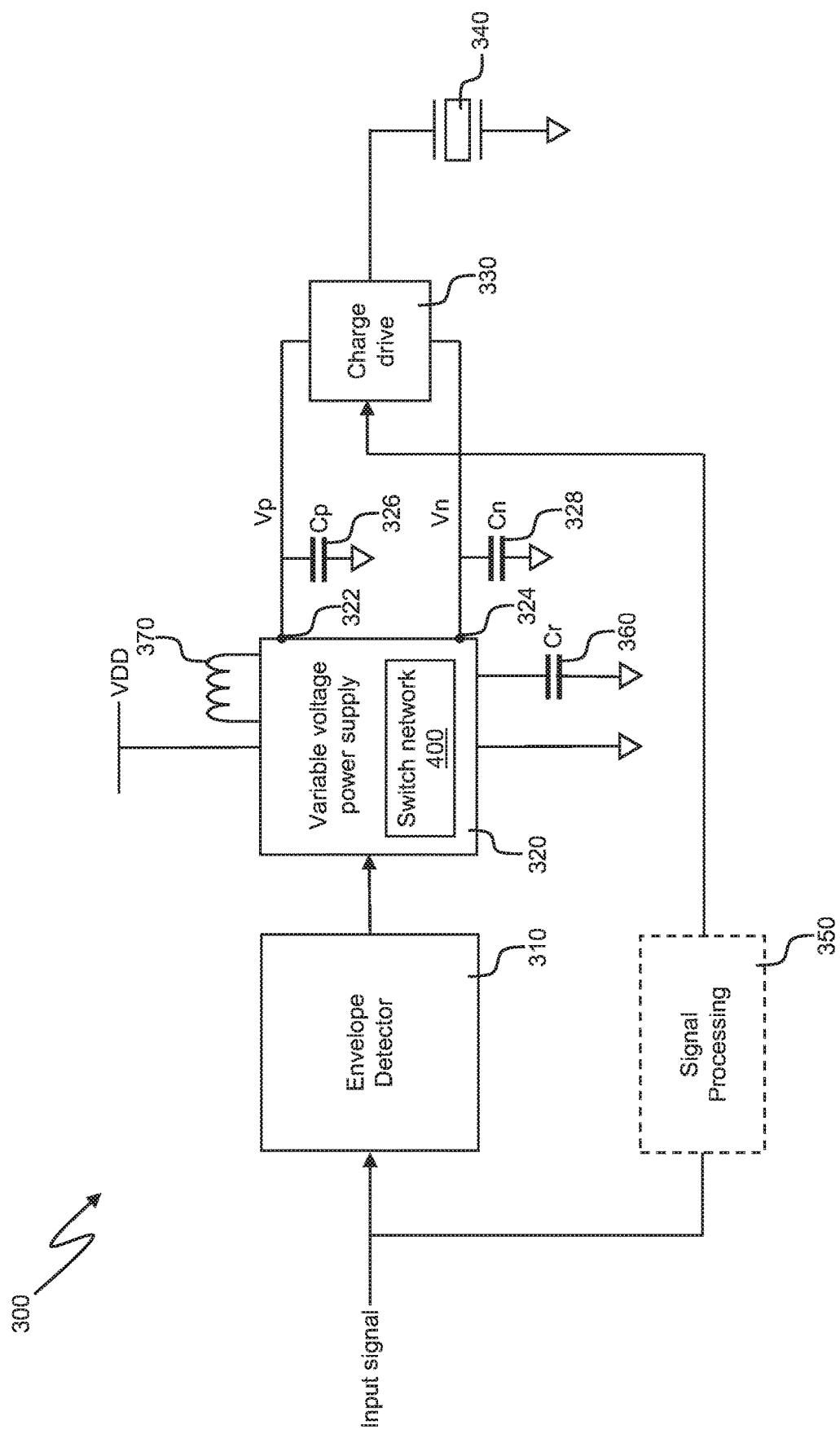
FIG. 3 is a schematic diagram illustrating circuitry for driving a piezoelectric transducer.

FIG. 3 is a schematic representation of circuitry for driving a piezoelectric transducer. The circuitry, shown generally at 300, includes envelope detector circuitry 310 that receives an electrical input signal (which may be a digital signal or an analogue signal), detects a size of the envelope of the electrical input signal and, outputs a control signal based on or indicative of the size of the envelope of the electrical input signal to variable voltage power supply circuitry 320.

The variable voltage power supply circuitry 320 receives a fixed supply voltage from positive (e.g. VDD) and reference (e.g. 0V or ground) voltage rails and, in the illustrated example, provides positive and negative supply voltages Vp, Vn to charge drive output stage circuitry 330, via respective first and second supply capacitors 326, 328. The first supply capacitor 326 (labelled Cp in FIG. 3) is coupled between a first output terminal 322 of the variable voltage power supply circuitry 320 and the reference supply voltage rail, whilst the second supply capacitor 328 (labelled Cn in FIG. 3) is coupled between a second output terminal 324 of the variable voltage power supply circuitry 320 and the reference supply voltage rail.

In the example illustrated in FIG. 3 the variable voltage power supply circuitry 320 provides positive and negative voltages Vp, Vn to the charge drive output stage circuitry 330. However, as will be appreciated by those of ordinary skill in the art, if the charge drive output stage circuitry 330 were configured to operate on, for example, a ground-referenced power supply, the variable voltage power supply circuitry 330 would provide only a positive power supply voltage to the charge drive output stage circuitry 330. In such an arrangement only a single supply capacitor would be required, coupled between a supply voltage output terminal of the variable voltage power supply circuitry 320 and the reference supply voltage rail.

The voltage(s) output by the variable voltage power supply circuitry 320 are dependent upon the control signal output by the envelope detector circuitry 310. Thus, if the control signal is indicative that the envelope of the input signal is increasing, the magnitude of the voltage(s) output by the variable voltage power supply circuitry increases. Conversely, if the control signal is indicative that the envelope of the input signal is decreasing, the magnitude of the voltage(s) output by the variable voltage power supply circuitry decreases.

For example, the variable voltage power supply circuitry 330 may implement a switching power supply, in which the first and second capacitors 326, 328 are charged and discharged as the switching power supply is switched on and off at a switching frequency. Thus the magnitude of the positive and negative output voltages Vp, Vn is dependent upon the switching frequency of the switching power supply. If the switching frequency is constant, the magnitude of the positive and negative output voltages Vp, Vn.

The control signal output by the envelope detector circuitry 310 may control the switching frequency of the switching power supply, such that while the envelope of the input signal remains constant, the positive and negative output voltages Vp, Vn also remain constant, but when the size of the envelope of the input signal decreases the magnitude of the positive and negative output voltages Vp, Vn also decrease, and when the size of the envelope of the input signal increases the magnitude of the positive and negative output voltages Vp, Vn also increases.

The charge drive output stage circuitry 330 is coupled to the variable voltage power supply circuitry 320 so as to receive the variable positive and negative voltages Vp, Vn as a power supply. The charge drive output stage circuitry 330 is also operative to receive the electrical input signal and to drive a piezoelectric transducer 340. The charge drive output stage circuitry 330 provides charge to the piezoelectric transducer 340 based on the received electrical input signal, and may comprise, for example, charge pump circuitry, linear amplifier circuitry or current source circuitry.

The circuitry 300 may further include signal processing circuitry 350 operative to receive the electrical input signal and to output a processed version of the electrical input signal to the charge drive output stage circuitry 330. The signal processing circuitry 350 may include, for example, filter circuitry, digital-to-analogue (DAC) circuitry, delay circuitry or the like, for modifying or otherwise processing the received input signal before it is transmitted to the charge drive output stage circuitry 330.

Processing of the input signal by the signal processing circuitry 350 delays the arrival of the processed version of the received signal at the charge drive circuitry. This delay is useful as it allows time for the envelope detector circuitry 310 to issue an appropriate control signal to the variable voltage power supply circuitry 320 to ensure that the magnitude of the positive and negative voltages Vp, Vn, supplied to the charge drive output stage circuitry 330 are sufficient to enable the charge drive output stage circuitry 330 to drive the piezoelectric transducer 340 without introducing distortion, but do not provide unnecessary and power-inefficient headroom in the voltage supplied to the charge drive output stage circuitry 330.

Thus, the envelope detector circuitry 310 provides look-ahead circuitry configured to transmit a control signal to the variable voltage power supply circuitry 320 based on the input signal, to cause the variable voltage power supply circuitry 320 to adjust the magnitude of the positive and negative voltages Vp, Vn supplied to the charge drive output stage circuitry 330 to accommodate the input signal that will be received by the charge drive output stage circuitry 330.

In an alternative example the envelope detector circuitry 310 may be replaced by level detector circuitry that detects a level, e.g. a voltage amplitude, of the electrical input signal and, outputs a control signal based on or indicative of the level of the electrical input signal to variable voltage power supply circuitry 320, so as to control or adjust the magnitude of the voltage(s) output by the variable voltage power supply circuitry 320.

The circuitry 300 further includes a reservoir capacitor 360 (labelled Cr in FIG. 3) and an inductor 370 associated with the variable voltage power supply circuitry 320. The reservoir capacitor 360 and the inductor 370 can be used, in conjunction with a switch network 400 (which is shown in FIG. 3 as being incorporated in the variable voltage power supply circuitry, but which could equally be provided separately from the variable voltage power supply circuitry), to improve further the power efficiency of the circuitry 300, by transferring charge between the reservoir capacitor 360 and the first and second capacitors 326, 328 as the supply requirements of the charge drive output stage circuitry 330 change. Although only one inductor is shown in FIG. 3, the circuitry may include two or more inductors, e.g. a first inductor to transfer charge from the variable voltage power supply circuitry 320 to the reservoir capacitor 360, and a second inductor to transfer charge between the reservoir capacitor 360 and the first and second capacitors 326, 328.

For example, when the level or envelope of the input signal is decreasing there might be more charge stored in the first and second capacitors 326, 328 than is required to supply the charge drive output stage circuitry 330 that drives the piezoelectric transducer 340. Instead of wasting power by discharging the first and second supply capacitors 326, 328 to ground in this situation, the excess charge is transferring to the reservoir capacitor 360, using the switch network 400 and the inductor 370. Conversely, when the level or envelope of the input signal is increasing, an increase in the amount of charge stored in the first and second supply capacitors 326, 328 is required in order to supply the charge drive output stage circuitry 330 to support the required output signal level. The required increase can be achieved at least in part by transferring stored charge from the reservoir capacitor 360, again using the switch network 400 and the inductor 370.

FIG. 4a illustrates an example switch network 400 for transferring charge between the reservoir capacitor 360 and the first and second capacitors 326, 328 in the circuitry 300 of FIG. 3.

The switch network 400 in the illustrated example includes first to fifth controllable switches 402-410, which may be, for example, MOSFET devices or the like.

The first switch 402 is coupled between a first plate of the reservoir capacitor 360 (a second plate of the reservoir capacitor 360 being coupled to the reference voltage rail) and a first terminal of the inductor 370, and is selectively operable to couple the first plate of the reservoir capacitor 360 to the first terminal of the inductor 370.

The second switch 404 is coupled between the first terminal of the inductor 370 and the reference voltage rail and is selectively operable to couple the inductor 370 to the reference voltage rail.

The third switch 406 is coupled between a second terminal of the inductor 370 and the first supply capacitor 326, and is selectively operable to couple the first supply capacitor 326 to the second terminal of the inductor 370.

The fourth switch 408 is coupled between the second terminal of the inductor 370 and the second supply capacitor 328, and is selectively operable to couple the second supply capacitor 328 to the second terminal of the inductor 370.

The fifth switch 406 is coupled between the second terminal of the inductor 370 and the reference voltage rail, and is selectively operable to couple the inductor 370 to the reference voltage rail.

Control circuitry 420 may be provided to control the operation of the switches to transfer charge between the reservoir capacitor 360 and the first and second capacitors 326, 328.

Figure 4B:
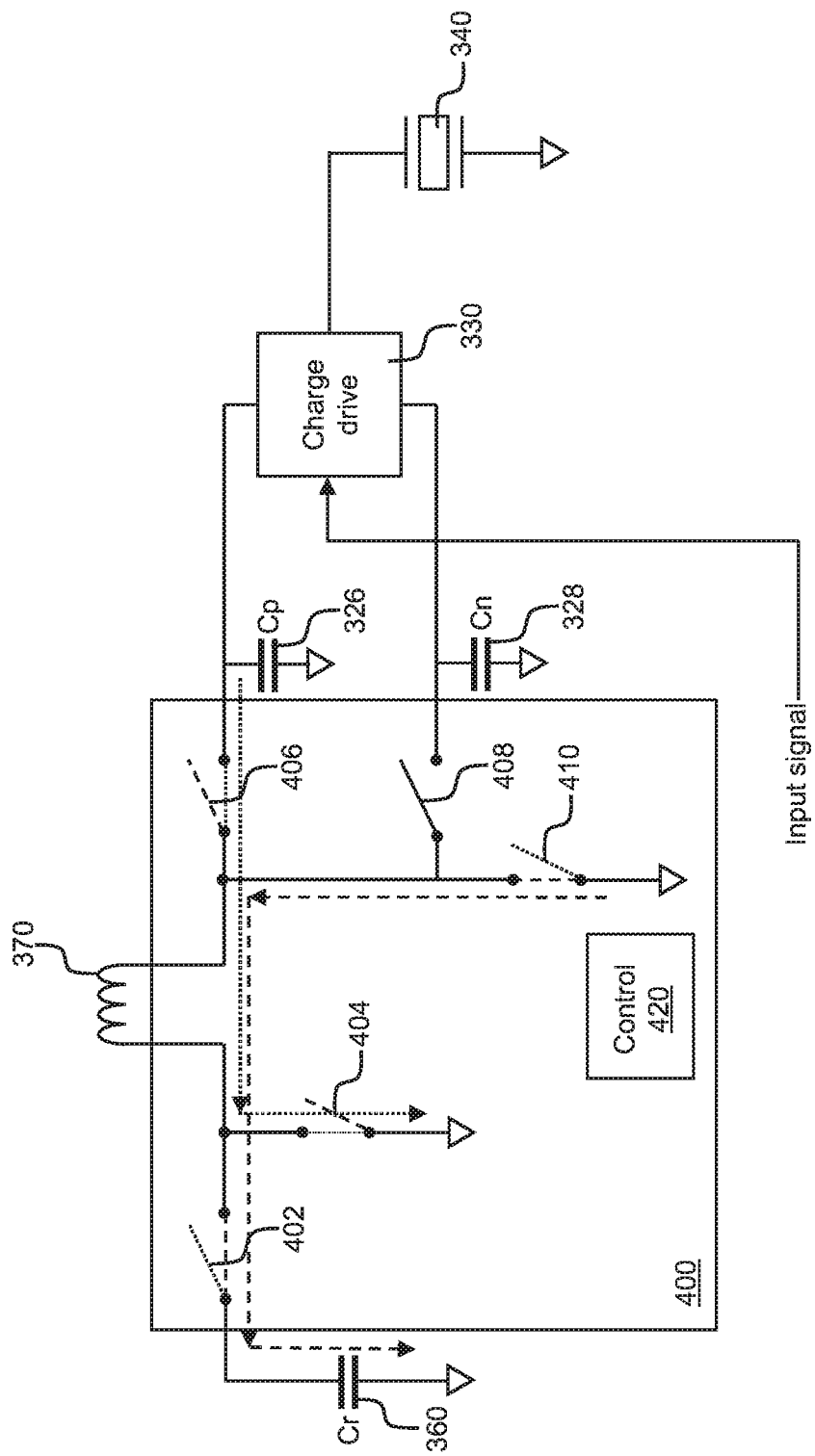
FIGS. 4b-4e illustrate the transfer of charge around the circuitry of FIG. 3.

FIG. 4b illustrates the use of the switch network 400 to transfer excess charge from the first supply capacitor 326 to the reservoir capacitor 360, such as may occur when the input signal level or envelope is decreasing, such that the supply requirements of the charge drive output stage circuitry 330 are reduced.

In a first phase of operation, the third switch 406 and the second switch 404 are closed and the first, fourth and fifth switches 402, 408, 410 are opened (as indicated by the dotted lines in FIG. 4b), in response to appropriate control signals from the control circuitry 420. A current path from the first supply capacitor 326 to the reference voltage supply rail via the inductor 370 is therefore established, and current flows from the first supply capacitor 326, as indicated by the dotted arrows in FIG. 4b. The flow of current from the first supply capacitor 326 causes a magnetic field to develop around the inductor 370, thus storing energy from the first supply capacitor 326.

In a second phase, which follows the first phase, the third switch 406 and the second switch 404 are opened and the first and fifth switches 402, 410 are closed (as indicated by the dashed lines in FIG. 4b), in response to appropriate control signals from the control circuitry 420 (the fourth switch 408 remains open). A current path now exists from the first inductor 370 to the reservoir capacitor 360. The magnetic field around the inductor 370 collapses, inducing a current in the inductor 370, which flows from the inductor 370 to the reservoir 360, as indicated by the dashed arrows in FIG. 4b, thereby charging the reservoir capacitor 360. Thus over the course of the first and second phases charge is transferred from the first supply capacitor 326 to the reservoir capacitor 360.

Figure 4C:
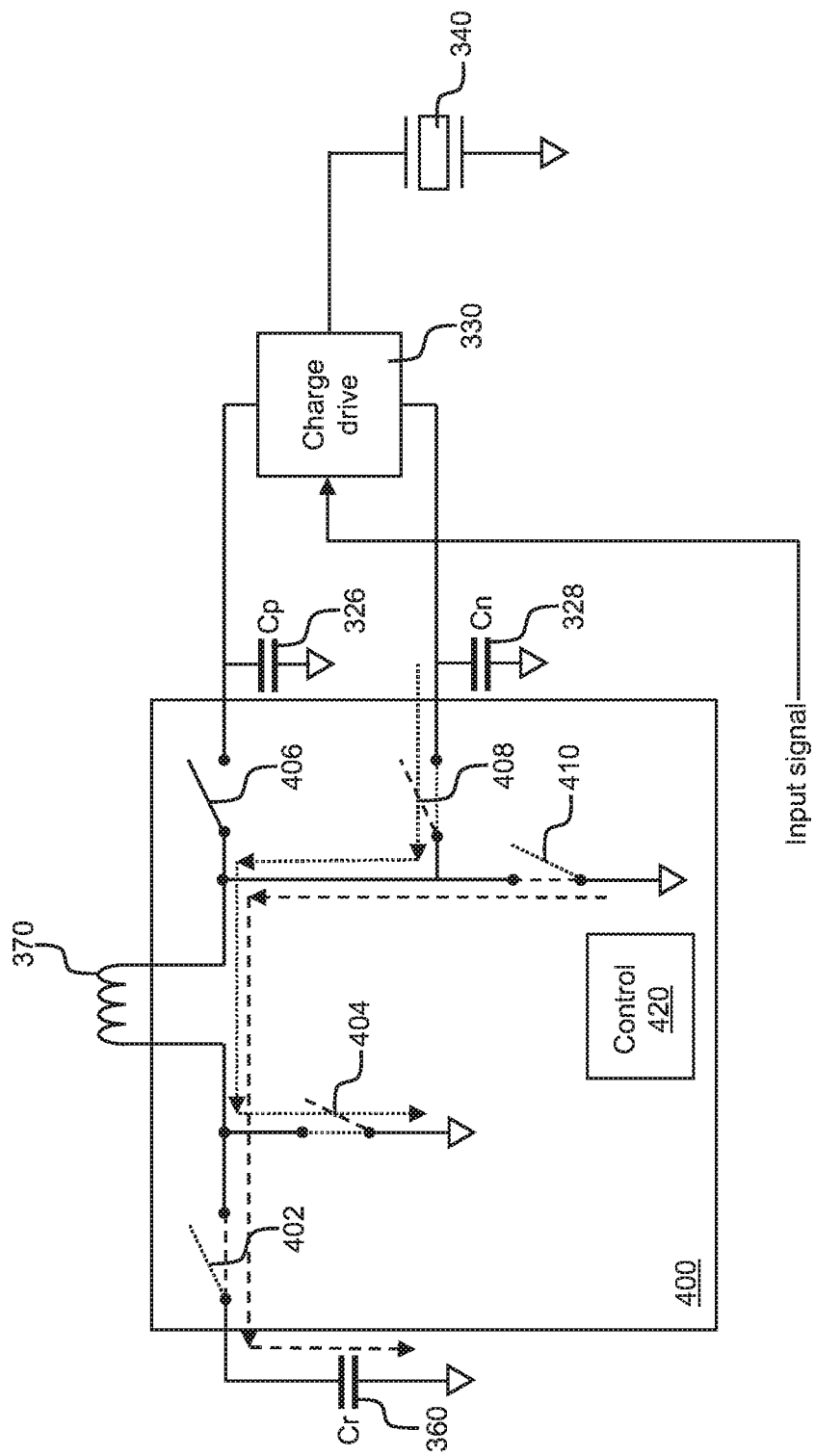

FIG. 4c illustrates the use of the switch network 400 to transfer excess charge from the second supply capacitor 328 to the reservoir capacitor 360, again as may occur when the input signal level or envelope is decreasing.

In a first phase, the fourth switch 408 and the second switch 404 are closed and the first, third and fifth switches 402, 406, 410 are opened (as indicated by the dotted lines in FIG. 4c), in response to appropriate control signals from the control circuitry 420. A current path from the second supply capacitor 328 to the reference voltage supply rail via the inductor 370 is therefore established, and current flows from the second supply capacitor 328, as indicated by the dotted arrows in FIG. 4c. The flow of current from the second supply capacitor 328 causes a magnetic field to develop around the inductor 370, thus storing energy from the second supply capacitor 328.

In a second phase, which follows the first phase, the fourth switch 408 and the second switch 404 are opened and the first and fifth switches 402, 410 are closed (as indicated by the dashed lines in FIG. 4c), in response to appropriate control signals from the control circuitry 420 (the third switch 406 remains open). A current path now exists from the first inductor 370 to the reservoir capacitor 360. The magnetic field around the inductor 370 collapses, inducing a current in the inductor 370, which flows from the inductor 370 to the reservoir 360, as indicated by the dashed arrows in FIG. 4c, thereby charging the reservoir capacitor 360. Thus over the course of the first and second phases charge is transferred from the second supply capacitor 328 to the reservoir capacitor 360.

Figure 4D:
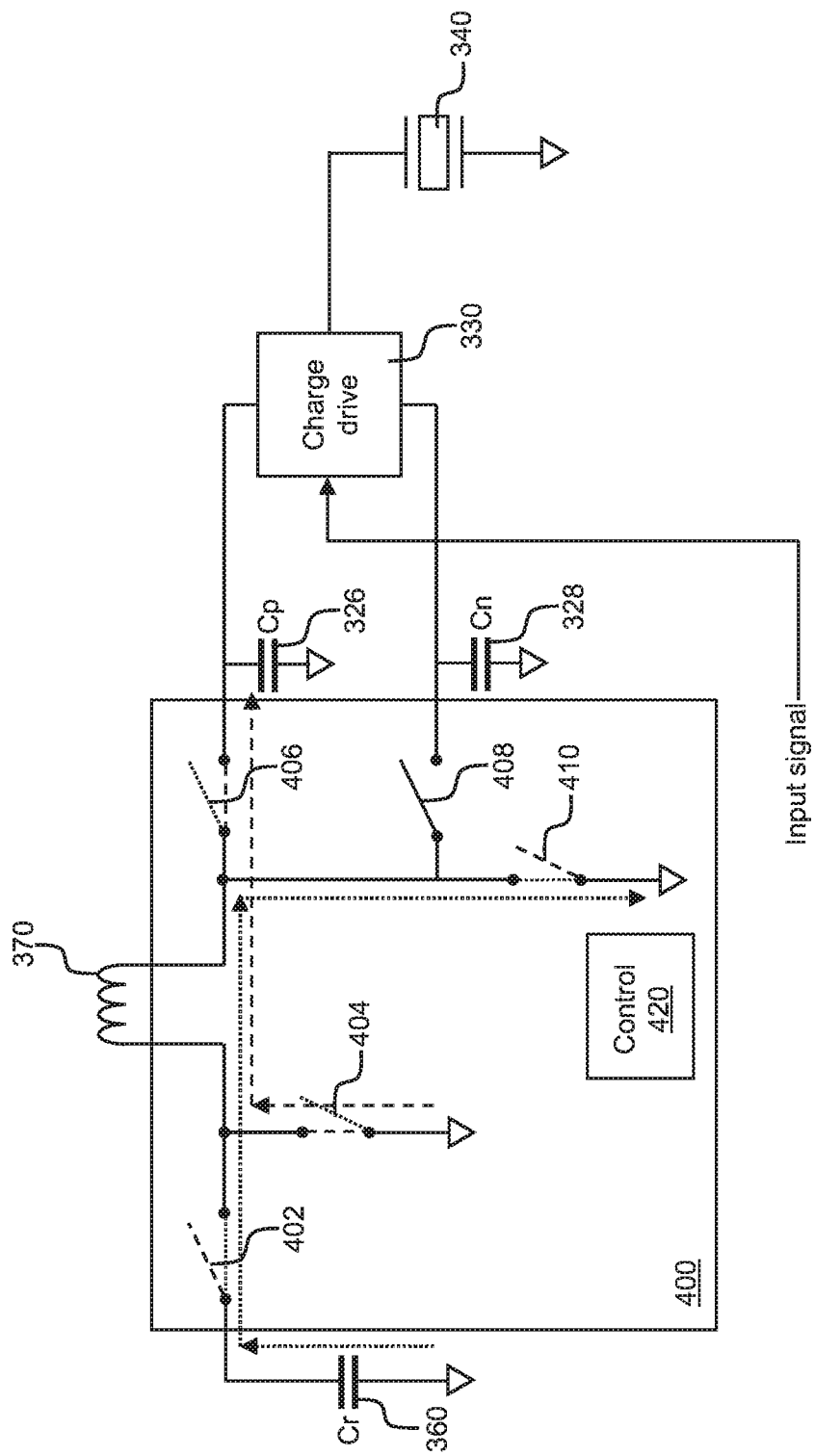

FIG. 4d illustrates the use of the switch network 400 to transfer charge from the reservoir capacitor 360 to the first supply capacitor 326, as may occur when the input signal level or envelope is increasing, such that the supply requirements of the charge drive output stage circuitry 330 are increased.

In a first phase, the first switch 402 and the fifth switch 410 are closed and the second, third and fourth switches 404, 406, 408 are opened (as indicated by the dotted lines in FIG. 4d), in response to appropriate control signals from the control circuitry 420. A current path from the reservoir capacitor 360 to the reference voltage supply rail via the inductor 370 is therefore established, and current flows from the reservoir capacitor 360, as indicated by the dotted arrows in FIG. 4d. The flow of current from the reservoir capacitor 360 causes a magnetic field to develop around the inductor 370, thus storing energy from the reservoir capacitor 360.

In a second phase, which follows the first phase, the first switch 402 and the fifth switch 410 are opened and the second and third switches 404, 406 are closed (as indicated by the dashed lines in FIG. 4d), in response to appropriate control signals from the control circuitry 420 (the fourth switch 408 remains open). A current path now exists from the inductor 370 to the first supply capacitor 326. The magnetic field around the inductor 370 collapses, inducing a current in the inductor 370, which flows from the inductor 370 to the first supply capacitor 326, as indicated by the dashed arrows in FIG. 4d, thereby charging the first supply capacitor 326. Thus over the course of the first and second phases charge is transferred from the reservoir capacitor 360 to the first supply capacitor 326.

Figure 4E:
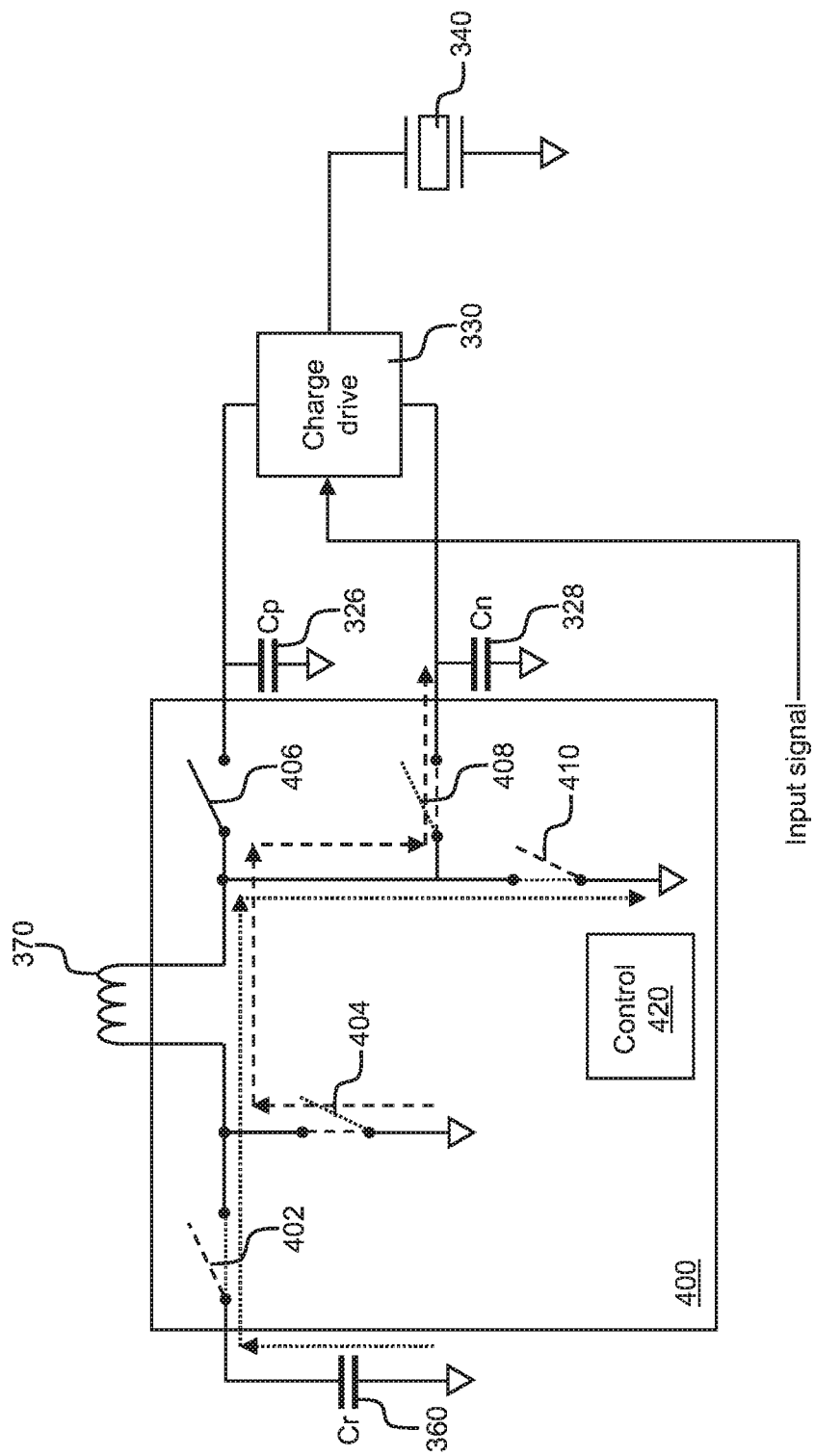

FIG. 4e illustrates the use of the switch network 400 to transfer charge from the reservoir capacitor 360 to the second supply capacitor 328, again as may occur when the input signal level or envelope is increasing, such that the supply requirements of the charge drive output stage circuitry 330 are increased.

In a first phase, the first switch 402 and the fifth switch 410 are closed and the second, third and fourth switches 404, 406, 408 are opened (as indicated by the dotted lines in FIG. 4e), in response to appropriate control signals from the control circuitry 420. A current path from the reservoir capacitor 360 to the reference voltage supply rail via the inductor 370 is therefore established, and current flows from the reservoir capacitor 360, as indicated by the dotted arrows in FIG. 4e. The flow of current from the reservoir capacitor 360 causes a magnetic field to develop around the inductor 370, thus storing energy from the reservoir capacitor 360.

In a second phase, which follows the first phase, the first switch 402 and the fifth switch 410 are opened and the second and fourth switches 404, 408 are closed (as indicated by the dashed lines in FIG. 4e), in response to appropriate control signals from the control circuitry 420 (the third switch 406 remains open). A current path now exists from the inductor 370 to the second supply capacitor 328. The magnetic field around the inductor 370 collapses, inducing a current in the inductor 370, which flows from the inductor 370 to the second supply capacitor 328, as indicated by the dashed arrows in FIG. 4e, thereby charging the second supply capacitor 328. Thus over the course of the first and second phases charge is transferred from the reservoir capacitor 360 to the second supply capacitor 328.

The control circuitry 420 receives the control signal output by the envelope detector circuitry 310 and controls the operation of the switches 402-410 accordingly to transfer charge between the reservoir capacitor 360 and the first and second capacitors 326, 328 in order to store excess charge from the first and second capacitors 326, 328 in the reservoir capacitor 360 when the input signal level or envelope decreases, and to provide charge from the reservoir capacitor 360 to the first and second capacitors 326, 328 when the input signal level or envelope increases, thereby reducing the amount of additional power that must be supplied by the variable voltage power supply circuitry 320 to the first and second capacitors 326, 328 to accommodate an increasing input signal, and increasing the power efficiency of the circuitry 300.

The charge drive output stage circuitry 330 may be implemented in a variety of different ways.

FIG. 5 is a schematic representation of charge pump circuitry for use as the charge drive output stage circuitry 330 to drive the piezoelectric transducer 340 to generate an output signal based on an input signal to the charge drive output stage circuitry 330.

The charge pump circuitry, shown generally at 500 in FIG. 5, includes a capacitor 510, a switch network 520 and control circuitry 530.

The switch network 520 includes first to fourth controllable switches 522-528, which may be, for example, MOSFET devices or the like.

The first switch 522 is coupled between a positive power supply rail 540, which receives the positive supply voltage Vp provided by the first supply capacitor 326 and a first (upper) plate of the capacitor 510. The first switch 522 is selectively operable to couple the first plate of the capacitor 510 to the positive supply rail 540.

The second switch 524 is coupled between a second (lower) plate of the capacitor 510 and a negative power supply rail 550, which receives the positive supply voltage Vp provided by the second supply capacitor 328. The second switch 524 is selectively operable to couple the second plate of the capacitor 510 to the negative supply rail 550.

The third switch 526 is coupled between the first plate of the capacitor 510 and a first (upper) terminal of the piezoelectric transducer 340, and is selectively operable to couple the first plate of the capacitor 510 to the piezoelectric transducer 340.

The fourth switch 528 is coupled between the second plate of the capacitor 510 and the first (upper) terminal of the piezoelectric transducer 340, and is selectively operable to couple the second plate of the capacitor 510 to the piezoelectric transducer 340.

A second (lower) terminal of the piezoelectric transducer is coupled to the reference voltage supply rail.

In use of the charge pump circuitry 500, the control circuitry 530 receives the input signal and transmits control signals to the controllable switches 522-528 to cause the switches 522-528 to open and close as necessary to charge the capacitor 510 and to transfer charge from the capacitor 510 to the piezoelectric transducer 430. Thus a desired output signal, based on the received input signal, can be produced by the piezoelectric transducer 340.

In a first phase of operation, the capacitor 510 is charged up by closing the first and second switches 522, 524. The third and fourth switches 526, 528 are closed in this phase.

Charge can then be transferred to the piezoelectric transducer 340 by opening the first switch 522 and closing the third switch 526. The second switch 524 remains closed, and the fourth switch 528 remains open. As the voltage across the capacitor 510 is greater than the voltage across the piezoelectric transducer 340, current flows from the capacitor 510 to the piezoelectric transducer 340, thus charging the piezoelectric transducer 340 and discharging the capacitor 510.

When charge is to be transferred from the piezoelectric transducer 340, the first and fourth switches 522, 528 are closed and the second and third switches 524, 526 are opened. Current can thus flow from the piezoelectric transducer 340 to the capacitor 510, thereby discharging the piezoelectric transducer 340 and charging the capacitor 510.

By controlling the operation of the switches 522-528 according to the received input signal, the charge drive output stage circuitry 500 can drive the piezoelectric transducer 340 to produce an output signal based on the input signal.

During operation of the charge pump circuitry 500 the control circuitry 530 monitors the voltage across the piezoelectric transducer 340 and the voltage across the capacitor 510 and transmits control signals to the switches to prevent the direction of charge transfer from reversing as the voltage across the capacitor 510 drops during transfer of charge to the piezoelectric 340 transducer, or vice versa. For example, when charge is being transferred from the capacitor 510 to the piezoelectric transducer 340, there could come a point when the voltage across the capacitor 510 drops below the voltage across the piezoelectric transducer 340 and the direction of current flow reverses. This can give rise to unwanted undershoot or overshoot in the signal output by the piezoelectric transducer 340 (which may look like a damped oscillation). By monitoring the voltages across the capacitor 510 and the piezoelectric transducer 340, the control circuitry 530 can transmit appropriate control signals to the switches, e.g. to cause the third switch 526 to open, thereby decoupling the piezoelectric transducer 340 from the capacitor 510 and preventing charge transfer from the piezoelectric transducer 340 to the capacitor 510 and thus preventing unwanted overshoot or undershoot.

FIG. 6 is a schematic representation of linear amplifier circuitry for use as the charge drive output stage circuitry 330 to drive the piezoelectric transducer 340 to generate an output signal based on an input signal to the charge drive output stage circuitry 330.

The linear amplifier circuitry, shown generally at 600 in FIG. 6, comprises an input stage 610 and an output stage 620. The input stage 610 is powered by a fixed voltage supply provided by positive (e.g. VDD) and reference (e.g. 0V or ground) voltage rails, whereas the output stage 620 receives its power supply from the positive and negative supply voltages Vp, Vn provided by the first and second supply capacitors 326, 328.

A first input of the input stage 610 receives the input signal (or a version of the input signal that has been processed by the signal processing circuitry 350). An output of the input stage 610 is coupled to an input of the output stage 620, and an output of the output stage 620 is coupled to the piezoelectric transducer 340. The output of the output stage 620 is also coupled to a second input of the input stage 620, thus forming a negative feedback loop which feeds back at least a portion of the signal output by the output stage 620 to the input stage.

This arrangement allows the positive and negative supply voltages to the output stage 620 to be adjusted as necessary to accommodate a particular input signal level without distortion in the signal output by the output stage to the piezoelectric transducer and without requiring excessive supply voltage headroom.

Figure 7:
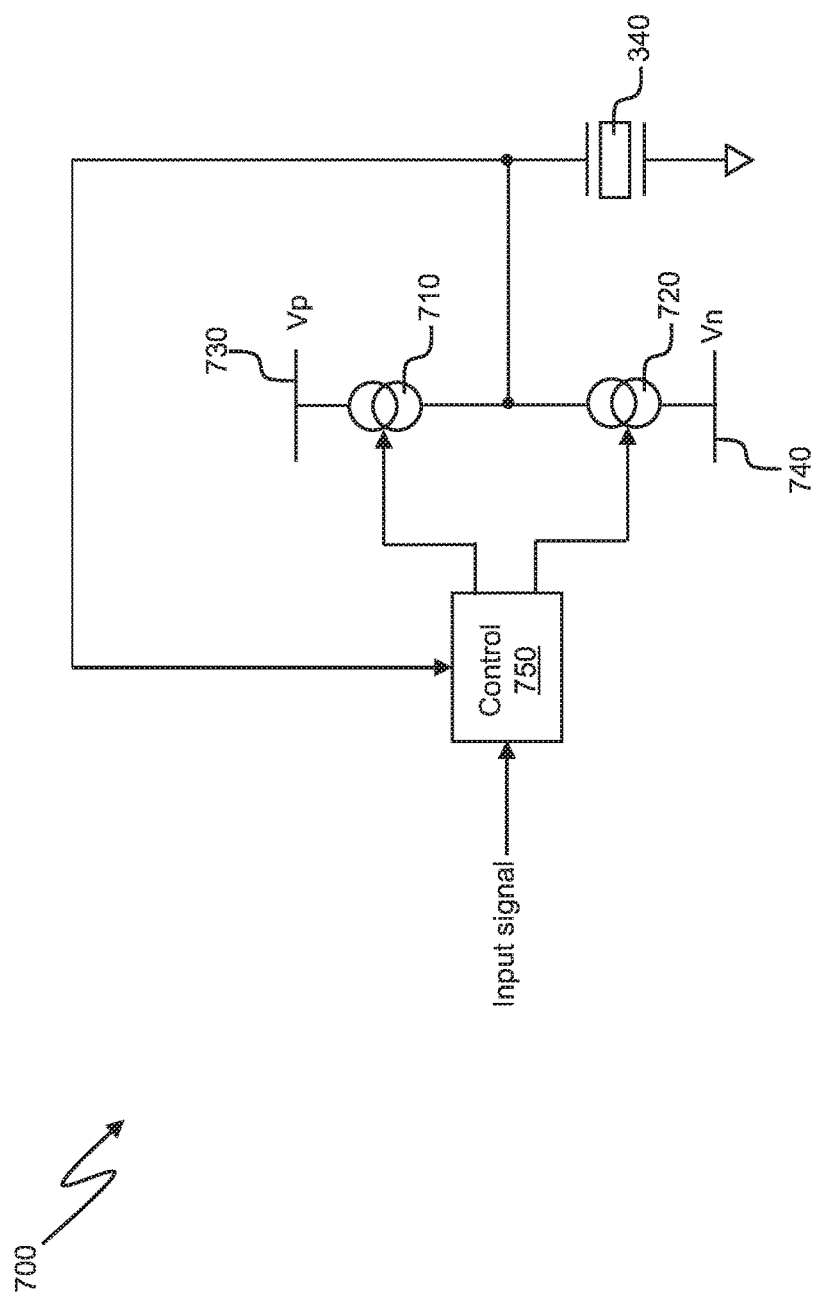
FIG. 7 is a schematic diagram illustrating a further alternative example of charge drive circuitry for driving a piezoelectric transducer.

FIG. 7 is a schematic representation of alternative charge drive output stage circuitry 330 which uses a current source and a current sink to drive the piezoelectric transducer 340 to generate an output signal based on an input signal to the charge drive output stage circuitry 330.

The charge drive circuitry, shown generally at 700 in FIG. 7, comprises a controllable current source 710 coupled in series with a controllable current sink 720 between a positive supply voltage rail 730, which receives the positive supply voltage Vp provided by the first supply capacitor 326 and a negative supply voltage rail 740, which receives the negative supply voltage Vn provided by the second supply capacitor 328. A first terminal of the piezoelectric transducer 340 is coupled to a node intermediate to the current source 710 and the current sink 720, while a second terminal of the piezoelectric transducer 340 is coupled to the reference voltage supply rail.

Control circuitry 750 is also provided to control the operation of the current source 710 and the current sink 720 based on a received input signal and a feedback signal received from the first terminal of the piezoelectric transducer 340. To charge up the piezoelectric transducer 340 the circuitry 750 transmits control signals to activate the current source 710 and to deactivate the current sink 720. Current thus flows from the current source 710 to the piezoelectric transducer 340 to charge it up. To discharge the piezoelectric transducer the control circuitry 750 transmits control signals to activate the current sink 720 and to deactivate the current source 710. Current thus flows from the piezoelectric transducer 340 to the current sink, thus discharging the piezoelectric transducer.

By controlling the current source 710 and the current sink 720 according to the received input signal and the feedback signal, the charge drive output stage circuitry 700 can drive the piezoelectric transducer 340 to produce an output signal based on the input signal.

The examples described above all drive a piezoelectric transducer 340 as a single-ended load, i.e. a first terminal of the piezoelectric transducer 340 is coupled to an output of the charge drive circuitry 330 and a second terminal of the piezoelectric transducer 340 is coupled to the reference voltage supply rail.

It may be advantageous to be able to make the drive bipolar, i.e. drive either of the terminals of the piezoelectric transducer 340. This can be achieved by using commutator circuitry coupled to the piezoelectric transducer 340, as will now be described with reference to FIG. 8.

Figure 8:
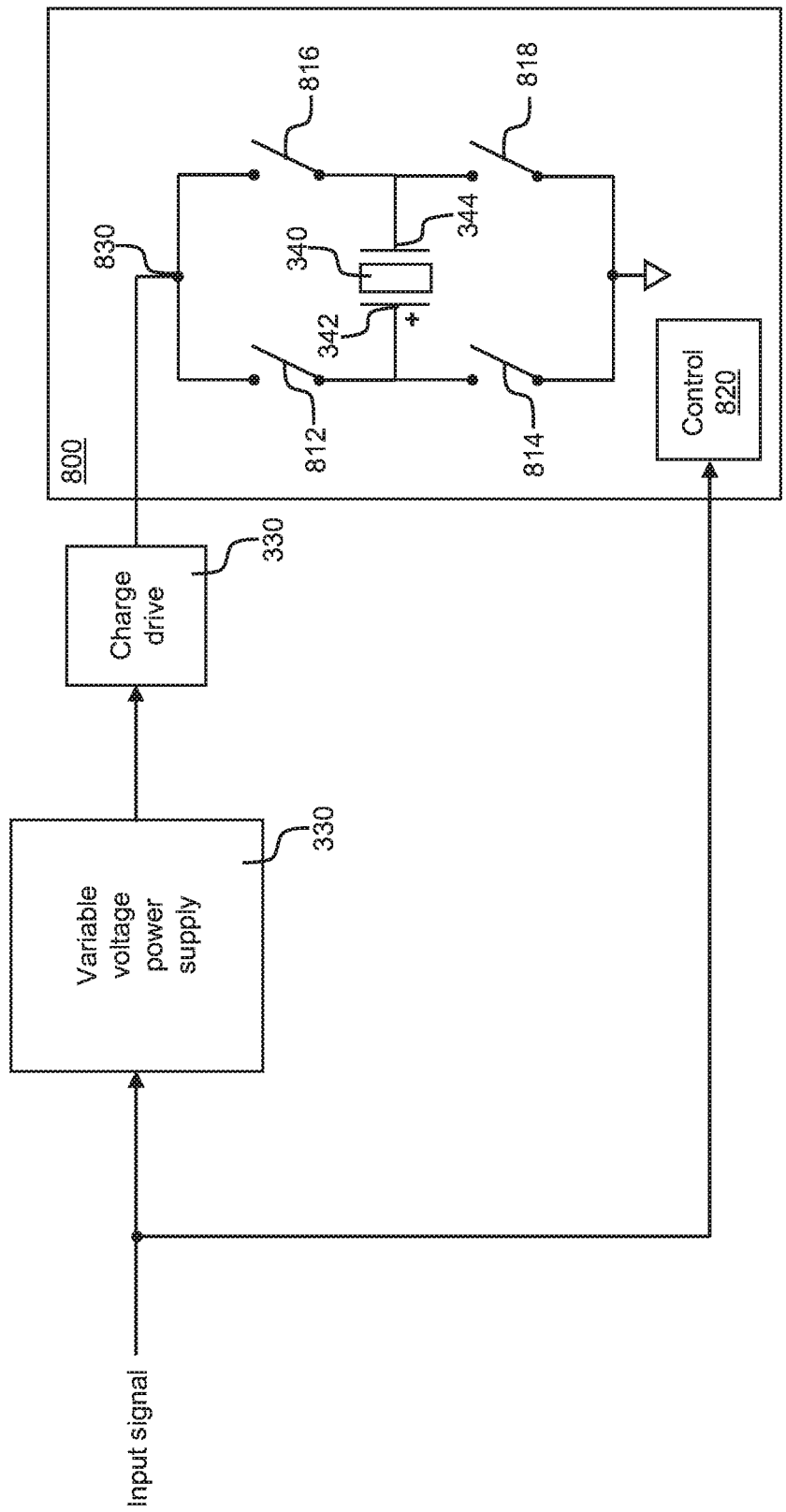
FIG. 8 is a schematic diagram illustrating commutator circuitry that can be used to provide bipolar drive of a piezoelectric transducer.

The commutator circuitry, shown generally at 800 in FIG. 8, includes first to fourth controllable switches 812-818 and control circuitry 820 for controlling the operation of the controllable switches 812-818 according to the input signal. FIG. 8 also shows variable voltage power supply circuitry 320 and charge drive circuitry 330 of the kind described above with reference to FIGS. 3-7 for driving a piezoelectric transducer 340.

The first controllable switch 812 is coupled between a first node 830 of the commutator circuitry 800 and a first terminal 342 of the piezoelectric transducer 340. The first node 830 of the commutator circuitry 800 is coupled to an output of the charge drive circuitry 330 that drives the piezoelectric transducer 340 as described above.

The second controllable switch 814 is coupled between the first terminal 342 of the piezoelectric transducer 340 and the reference voltage supply rail.

The third controllable switch 816 is coupled between the first node 830 of the commutator circuitry 800 and a second terminal 344 of the piezoelectric transducer 340.

The fourth controllable switch 818 is coupled between the second terminal 344 of the piezoelectric transducer 340 and the reference voltage supply rail.

By selectively opening and closing the controllable switches 812-816 one of the first and second terminals 342, 344 of the piezoelectric transducer 340 can be coupled to the output of the charge drive circuitry 330, and the other of the first and second terminals 342, 344 of the piezoelectric transducer 340 can be coupled to the reference voltage supply rail.

The operation of the controllable switches 812-818 is controlled by the control circuitry 820 according to the polarity (with respect to the reference voltage) of the input signal, as shown in the table below.

| Input signal polarity | First switch 812 | Second switch 814 | Third switch 816 | Fourth switch 818 |
| --- | --- | --- | --- | --- |
| Positive | Controlled by variable voltage power supply 320 | Open | Open | Closed |
| Negative | Open | Closed | Controlled by variable voltage power supply 320 | Open |

Thus, when the input signal is positive, the fourth switch 818 is closed, thereby coupling the second terminal 344 of the piezoelectric transducer 340 to the reference voltage supply rail. The second and third switches 814, 816 are open, and the first switch 812 is controlled by the variable voltage power supply circuitry 320. When charge is to be transferred to the first terminal 342 of the piezoelectric transducer 340, the first switch 812 is closed, thus coupling the first terminal 342 of the piezoelectric transducer 340 to the output of the charge drive circuitry 330.

When the input signal is negative, the second switch 814 is closed, thereby coupling the first terminal 342 of the piezoelectric transducer 340 to the reference voltage supply rail. The first and fourth switches 812, 818 are open, and the third switch 816 is controlled by the variable voltage power supply circuitry 320. When charge is to be transferred to the second terminal 344 of the piezoelectric transducer 340, the third switch 816 is closed, thus coupling the second terminal 344 of the piezoelectric transducer 340 to the output of the charge drive circuitry 330.

Thus either the first terminal 342 or the second terminal 344 of the piezoelectric transducer 340 can be driven by the charge drive circuitry 330, depending on the polarity of the input signal.

As will be apparent from the foregoing discussion, the circuitry of the present disclosure provides a power efficient means for driving a piezoelectric transducer that reduces the hysteresis and creep that can arise when such a piezoelectric transducer is voltage-driven. Improved power efficiency arises due to the recycling of charge between the reservoir capacitor and the supply capacitor(s) as the supply voltage to the charge drive output stage changes based on the level or envelope of the input signal.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a piezoelectric transducer, the circuitry comprising:
   charge drive output stage circuitry configured to receive an input signal and to drive the piezoelectric transducer, by charging the piezoelectric transducer based on the received input signal such that a displacement of the piezoelectric transducer is based on a level of charge of the piezoelectric transducer, to produce an output signal based on the input signal;
   variable voltage power supply circuitry configured to output a supply voltage for the charge drive output stage circuitry, wherein the supply voltage output by the variable voltage power supply circuitry varies based on the input signal;
   a supply capacitor for receiving the supply voltage output by the variable voltage power supply circuitry;
   a reservoir capacitor; and
   circuitry for transferring charge between the reservoir capacitor and the supply capacitor, wherein the charge drive output stage circuitry comprises charge pump circuitry.

2. Circuitry according to claim 1 further comprising circuitry configured to transmit a control signal to the variable voltage power supply circuitry to cause the variable voltage power supply circuitry to adjust the magnitude of the supply voltage for the output stage circuitry based on the input signal.

3. Circuitry according to claim 2 wherein the circuitry configured to transmit a control signal to the variable voltage power supply circuitry to cause the variable voltage power supply circuitry to adjust the magnitude of the supply voltage for the output stage circuitry based on the input signal comprises look-ahead circuitry.

4. Circuitry according to claim 3 wherein the look-ahead circuitry is configured to monitor a level of the input signal, and wherein the control signal is based on the level of the input signal.

5. Circuitry according to claim 3 wherein the look-ahead circuitry is configured to monitor an envelope of the input signal, and wherein the control signal is based on the envelope of the input signal.

6. Circuitry according to claim 1 wherein the circuitry for transferring charge between the reservoir capacitor and the supply capacitor comprises a switch network and one or more inductors.

7. Circuitry according to claim 6 further comprising control circuitry to control operation of the switch network to transfer charge between the reservoir capacitor and the supply capacitor via at least one of the one or more inductors.

8. Circuitry according to claim 1 wherein the variable voltage power supply circuitry is configured to output a positive supply voltage and a negative supply voltage for the charge drive output stage circuitry.

9. Circuitry according to claim 8 comprising a first supply capacitor for the positive supply voltage and a second supply capacitor for the negative supply voltage.

10. Circuitry according to claim 1 further comprising signal processing circuitry configured to process the input signal and to output a processed version of the input signal to the charge drive output stage circuitry.

11. Circuitry according to claim 10 wherein the signal processing circuitry comprises one or more of:
filter circuitry;
digital-to-analogue converter circuitry;
envelope detector circuitry; and
delay circuitry.

12. Circuitry according to claim 1 wherein the input signal is an audio signal, a haptic signal or an ultrasonic signal.

13. Circuitry according to claim 1 further comprising commutator circuitry coupled to the output stage circuitry, the commutator circuitry being configured to selectively couple a first or a second terminal of the piezoelectric transducer to an output of the output stage circuitry.

14. Integrated circuitry comprising the circuitry of claim 1.

15. A device comprising the circuitry of claim 1, wherein the device comprises a mobile telephone, a tablet or laptop computer, a smart speaker, an accessory device, headphones, earphones or earbuds.

* * * * *